US012568780B2

(12) United States Patent
Chen et al.

(10) Patent No.: US 12,568,780 B2
(45) Date of Patent: Mar. 3, 2026

(54) SEMICONDUCTOR DEVICE AND METHOD OF MANUFACTURING

(71) Applicant: TAIWAN SEMICONDUCTOR MANUFACTURING COMPANY, LTD., Hsinchu (TW)

(72) Inventors: Yan-Yu Chen, Hsinchu (TW); Wei Tse Hsu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 374 days.

(21) Appl. No.: 18/320,395

(22) Filed: May 19, 2023

(65) Prior Publication Data

US 2024/0387184 A1     Nov. 21, 2024

(51) Int. Cl.
*H01L 21/3065* (2006.01)
*H01L 23/00* (2006.01)

(52) U.S. Cl.
CPC .......... *H01L 21/3065* (2013.01); *H01L 24/29* (2013.01); *H01L 24/32* (2013.01); *H01L 24/83* (2013.01); *H01L 2224/29187* (2013.01); *H01L 2224/32221* (2013.01); *H01L 2224/83002* (2013.01); *H01L 2224/83896* (2013.01); *H01L 2224/83931* (2013.01); *H01L 2924/1011* (2013.01); *H01L 2924/1511* (2013.01); *H01L 2924/15159* (2013.01)

(58) Field of Classification Search
CPC .......... H01L 2221/68327; H01L 21/00; H01L 2221/00
See application file for complete search history.

(56) References Cited

U.S. PATENT DOCUMENTS

| | | | | |
|---|---|---|---|---|
| 7,883,991 B1 * | 2/2011 | Wu | ...................... | H01L 25/0657 |
| | | | | 438/455 |
| 10,879,212 B2 * | 12/2020 | Uzoh | ...................... | H01L 24/08 |
| 2002/0016135 A1 * | 2/2002 | Iwasaki | .............. | H01L 21/6835 |
| | | | | 451/41 |
| 2003/0232580 A1 * | 12/2003 | Mashino | ............. | H01L 21/6835 |
| | | | | 451/41 |
| 2006/0183349 A1 * | 8/2006 | Farnworth | .............. | H01L 21/56 |
| | | | | 257/E21.597 |
| 2010/0279463 A1 * | 11/2010 | Hsiao | .................. | H01L 21/6835 |
| | | | | 438/107 |

FOREIGN PATENT DOCUMENTS

| | | | | |
|---|---|---|---|---|
| CN | 114937594 | 8/2022 | | |
| KR | 20150023360 A | * 3/2015 | ......... | H01L 21/6835 |
| WO | 2022057013 | 3/2022 | | |

* cited by examiner

*Primary Examiner* — Evren Seven
(74) *Attorney, Agent, or Firm* — Hauptman Ham, LLP

(57) ABSTRACT

A method of manufacturing a semiconductor device includes reducing a thickness of a device wafer bonded to a carrier wafer, wherein the device wafer includes a device, a portion of the carrier wafer beyond the device, in a plan view, is called a non-bonding area, and a portion of the carrier wafer overlapping the device, in the plan view, is called a device area. The method further includes performing an etching process on the non-bonding area of the carrier wafer, wherein the etching process is performed completely outside the device area of the carrier wafer.

20 Claims, 6 Drawing Sheets

200

205 — Bond a device wafer to a carrier wafer

210 — Perform removal process on non-bonding area of device wafer

215 — Reduce device wafer thickness

220 — Perform etching process to remove a portion of non-bonding area of carrier wafer 225 — De-bond device from carrier wafer

SEMICONDUCTOR DEVICE AND METHOD OF MANUFACTURING

BACKGROUND

During manufacturing of a semiconductor device having interconnect elements on both sides of a substrate, the semiconductor device is bonded to a carrier wafer during processing operations performed on a backside of the substrate. During the processing operations, residual material from photoresists and other materials from the processing operations are trapped within an overhang in the carrier wafer, in some instances. Following the processing operations being performed on the backside of the substrate, photoresists remain attached to the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
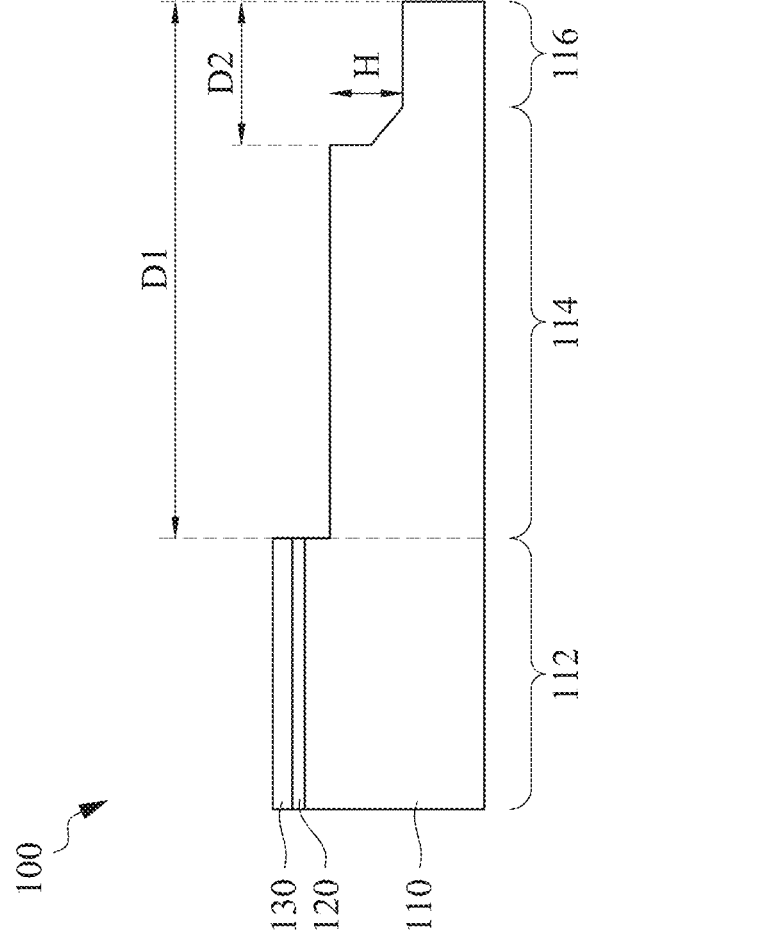
FIG. 1 is a cross-sectional view of a semiconductor device in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below." "lower." "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As semiconductor device technology nodes continue to shrink, routing schemes that utilize interconnect structures on both sides of a substrate are used in order to achieve smaller device sizes, in some embodiments. The interconnect structures include conductive lines running parallel to the surfaces of the substrate. The interconnect structures further include conductive vias that electrically connect the conductive lines located at different levels of the interconnect structures. The interconnect structures also include power rails, such as super power rails, which also run parallel to the surfaces of the substrate. In some embodiments, the power rails have a larger dimension than other conductive lines in order to reduce resistance within the power rails.

During the manufacturing of the semiconductor device having interconnect structures on both sides of the substrate, a first interconnect structure is formed on a first side, also called front side, of a device substrate for the semiconductor device. The device substrate is then bonded to a carrier wafer. The device substrate is then thinned and a second interconnect structure is formed on a second side, also called back side, of the device substrate for the semiconductor device. In some instances, the bonding process and the thinning of the substrate causes an overhang structure to form on an edge of the carrier wafer. During subsequent processing of the device substrate, residual material is trapped in the overhang structure after thinning of the device substrate. This residual material interferes with subsequent processing operations, in some instances. For example, in some instances, residue photoresist material is trapped in the overhang structure during thinning of the device substrate. Then, during a subsequent wet etching process, the residue photoresist material comes out of the overhang structure and is re-deposited on the back side of the device substrate. The re-deposited photoresist material interferes with subsequent processing operations and increases a risk of device failure. As a result, a risk of decreased production yield increases as a result of the overhang structure and the residual material trapped therein.

The current description provides a method that reduces or prevents the overhang structure on the carrier wafer. The reduced overhang structure, or absence of an overhang structure, minimizes residual material being trapped within the overhang structure. The reduced residual material within the overhang structure, in turn, reduces the risk of interference with subsequent processing operations and increases production yield. In some embodiments, the method includes a trimming process on a non-bonding area of a device wafer; a thinning of the device wafer; and a corona etching process on the non-bonding area of the device wafer. This combination of processing operations prevents or reduces an overhang structure within the carrier wafer.

FIG. 1 is a cross-sectional view of a semiconductor device 100 in accordance with some embodiments. The semiconductor device 100 includes a carrier wafer 110. A bonding oxide 120 is over the carrier wafer 110. A device 130 is bonded to the bonding oxide 120 to secure the device 130 to the carrier wafer 110. The carrier wafer 110 includes a device area 112 where the device 130 is located. The carrier wafer 110 further includes a non-bonding area 114 adjacent to the device area 112. The carrier wafer 110 further includes an edge area 116 between the non-bonding area 114 and an outermost periphery of the carrier wafer 110.

The carrier wafer 110 provides structural support for the device 130 during processing of a backside of the device 130, such as forming an interconnect structure on the backside of the device 130. In some embodiments, the carrier wafer 110 includes silicon. In some embodiments, the carrier wafer 110 includes a semiconductor material other than silicon, such as germanium. In some embodiments, the carrier wafer 110 includes a semiconductor-on-insulator (SOI) structure.

The carrier wafer 110 includes a device area 112 which is under the device 130. In some embodiments, a distance D1 from an outermost periphery, also called edge, of the carrier wafer 110 to a boundary of the device area 112 ranges from about 1.5 millimeters (mm) to about 1.9 mm. In some embodiments, the distance D1 is approximately 1.7 mm. If the distance D1 is too great, then a larger portion of the carrier wafer 110 is not utilized and material waste increases, in some instances. If the distance D1 is too small, then a risk of damage to the device 130 or peeling of the device 130 from the carrier wafer 110 increases due to proximity between the device 130 and the edge of the carrier wafer 110, in some instances.

The carrier wafer 110 further includes a non-bonding area 114 which is between the device area 112 and the outermost periphery, also called edge, of the carrier wafer 110. The non-bonding area 114 provides a buffer region between the device 130 and the edge of the wafer in order to reduce the risk of damage to the device 130 or peeling of the device 130 from the carrier wafer 110. In some embodiments, a topmost surface of the non-bonding area 114 is coplanar with a topmost surface of the device area 112. In some embodiments, the topmost surface of the device area 112 is above the topmost surface of the non-bonding area 114. That is, the carrier wafer 110 is thicker in the device area 112 than in the non-bonding area 114, in some embodiments.

In some embodiments, a distance D2 from the outermost periphery of the carrier wafer 110 to a boundary of the non-bonding area 114 ranges from about 0.3 mm to about 0.45 mm. In some embodiments, the distance D2 is approximately 0.4 mm. If the distance D2 is too great, then a larger portion of the carrier wafer 110 is not utilized and material waste increases, in some instances. If the distance D2 is too small, then a risk of damage to the device 130 increases due to proximity between the device 130 and the edge of the carrier wafer 110, in some instances. In some embodiments, a ratio between the distance D1 and the distance D2 ranges from about 3.3:1 to about 6.3:1. If the ratio is too small, then the buffer effect for the device 130 is reduced and a risk of damage to the device 130 or peeling of the device 130 from the carrier wafer 110 increases, in some instances. If the ratio is too large, then non-utilized portions of the carrier wafer 110 increase and material waste increases, in some instances.

The carrier wafer 110 further includes an edge area 116 between the outermost periphery of the carrier wafer 110 and the non-bonding area 114. The edge area 116 is a portion of the carrier wafer 110 adjacent to the edge of the carrier wafer 110 at a location where material, such as sealant, is applied to assist the bonding of the carrier wafer 110 to a device wafer (FIG. 3A) that includes the device 130. The topmost surface of the edge area 116 is below the topmost surface of the non-bonding area 114. In some embodiments, a height H between the topmost surface of the edge area 116 and the topmost surface of the non-bonding area 114 ranges from about 50 microns (μm) to about 60 μm. If the height H is too small, then a risk of an incomplete removal of the sealant increases, in some instances. If the height His too great, then unnecessary cost is incurred because additional material is removed from the carrier wafer 110 without a significant improvement in performance, in some instances.

The bonding oxide 120 is used to bond the device 130 to the carrier wafer 110. The bonding oxide 120 is located in the device area 112 of the carrier wafer 110. In some embodiments, the bonding oxide 120 does not extend into the non-bonding area 114 of the carrier wafer 110. In some embodiments, the bonding oxide 120 is usable to form a fusion bond with the device 130. In some embodiments, the bonding oxide 120 is usable to form a hybrid bond with the device 130. In some embodiments, a thickness of the bonding oxide 120 ranges from about 1.5 μm to about 1.7 μm. If the thickness of the bonding oxide 120 is too small, a risk of separation between the device 130 and the carrier wafer 110 increases, in some instances. If the thickness of the bonding oxide 120 is too great, then additional material is used without significant improvement in performance, in some instances. In some embodiments, the bonding oxide 120 is replaced with a different bonding material, such as a metal foil or a semiconductor material.

The device 130 includes an element usable in manufacturing an integrated circuit. In some embodiments, the device 130 includes an active component, such as a transistor. In some embodiments, the device 130 includes a passive component, such as a capacitor. In some embodiments, the device 130 includes a first interconnect structure that is bonded to the bonding oxide 120. In some embodiments, the device 130 includes a second interconnect structure on a surface of the device 130 opposite to the bonding oxide 120.

Figure 2:
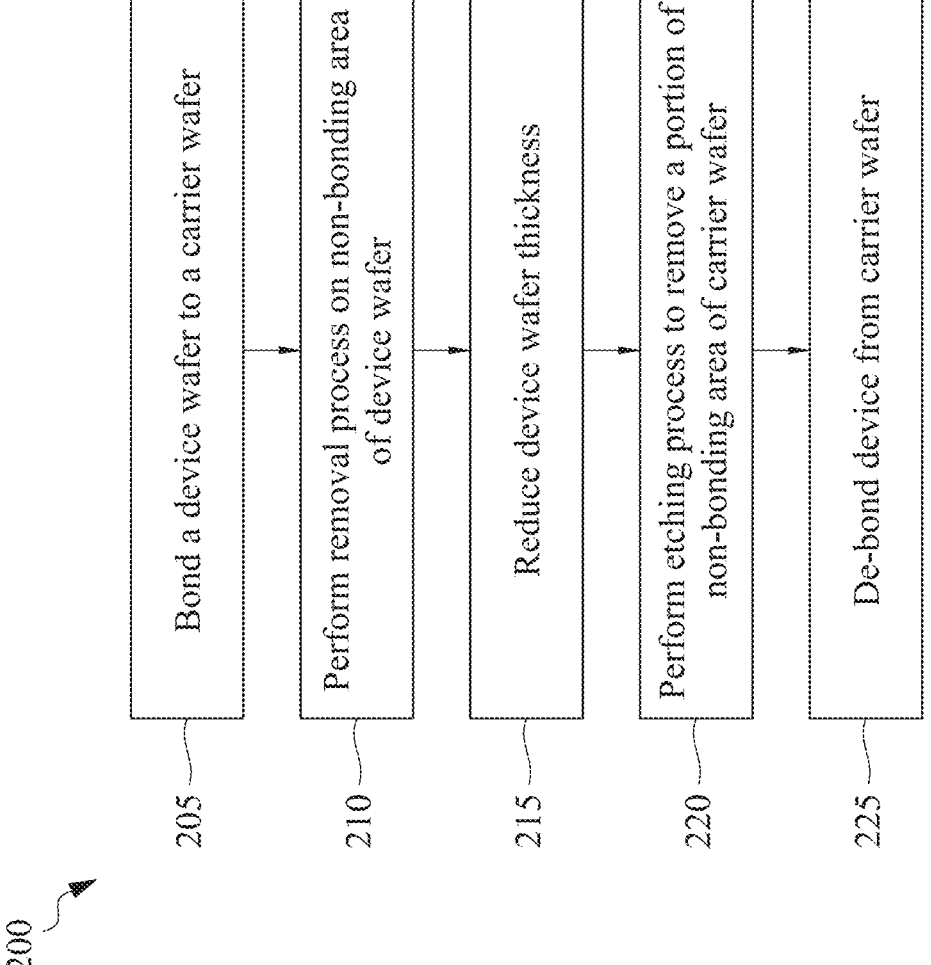
FIG. 2 is a flowchart of a method of manufacturing a semiconductor device in accordance with some embodiments.

FIG. 2 is a flowchart of a method 200 of manufacturing a semiconductor device in accordance with some embodiments. The method 200 includes operations for producing a semiconductor device having little or no overhang structure in a carrier wafer. As a result, a device produced using the method 200 has improved yield in comparison with other approaches. In some embodiments, the method 200 is usable to produce the semiconductor device 100 (FIG. 1). In some embodiments, the method 200 is usable to produce a semiconductor device other than the semiconductor device 100 (FIG. 1).

In operation 205, a device wafer is bonded to a carrier wafer. In some embodiments, the device wafer is bonded to the carrier wafer using an oxide-to-oxide bond, also called fusion bond. In some embodiments, the device wafer is bonded to the carrier wafer using a semiconductor-to-oxide bond, also called hybrid bond. In some embodiments, a layer of oxide material is formed on the carrier wafer prior to bonding the device wafer to the carrier wafer. In some embodiments, the layer of oxide material is formed on the device wafer prior to bonding the device wafer to the carrier wafer. In some embodiments, the oxide layer is formed using thermal oxidation, chemical vapor deposition (CVD), or another suitable formation process.

In some embodiments, a force applied during the bonding process ranges from about 10 pounds per square inch (psi) to about 100 psi. If the force applied is too small, then a risk of incomplete bonding increases, in some instances. If the force applied is too great, then a risk of damage to the device wafer increases, in some instances. In some embodiments, a temperature applied during the bonding process ranges from about 100° C. to about 300° C. If the temperature applied is too small, then a risk of incomplete bonding increases, in some instances. If the temperature applied is too great, then a risk of damage to the device wafer increases, in some instances. In some embodiments, a duration of the bonding process ranges from about 10 minutes to about 60 minutes. If the duration is too small, then a risk of incomplete bonding increases, in some instances. If the duration is too great, then a risk of damage to the device wafer increases, in some instances.

In some embodiments, an edge of at least one of the carrier wafer or the device wafer is beveled prior to the bonding process. In some embodiments, the beveling of the carrier wafer or the device wafer is performed using an etching process. In some embodiments, a sealant is injected at an edge of the carrier wafer and the device wafer to strengthen the bonding between the device wafer and the carrier wafer. The beveling of at least one of the carrier wafer or the device wafer provides sufficient space for the sealant to be injected. In some embodiments, the sealant comprises a resin.

Figure 3A:
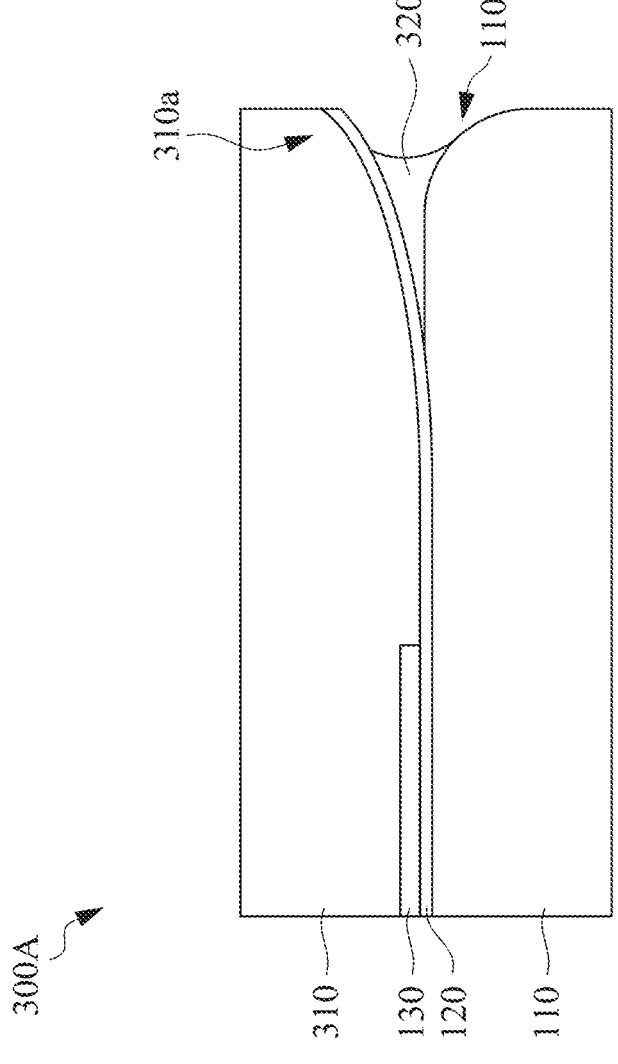
FIGS. 3A-3D are cross-sectional view of a semiconductor device in accordance with some embodiments.

FIG. 3A is a cross-sectional view of a semiconductor device 300A in accordance with some embodiments. In some embodiments, the semiconductor device 300A is a cross-sectional view following operation 205 of the method 200 (FIG. 2). In some embodiments, the semiconductor device 300A is a cross-sectional view during a method other than the method 200 (FIG. 2). The semiconductor device 300A includes the carrier wafer 110 and the bonding oxide 120. The carrier wafer 110 and the bonding oxide 120 are similar to the corresponding components in the semiconductor device 100 (FIG. 1) and are not discussed in detail for the sake of brevity. The carrier wafer 110 includes a beveled edge 110a.

The semiconductor device 300A further includes a device wafer 310. The device wafer 310 includes a beveled edge 310a. In some embodiments, at least one of the beveled edge 110a for the carrier wafer 110 or the beveled edge 310a for the device wafer 310 is omitted. The device wafer 310 is usable to form the device 130. The device 130 is similar to the corresponding component in the semiconductor device 100 (FIG. 1) and is not discussed in detail for the sake of brevity. In some embodiments, the device wafer 310 includes silicon. In some embodiments, the device wafer 310 includes a semiconductor material other than silicon, such as germanium. In some embodiments, the device wafer 310 includes a semiconductor-on-insulator (SOI) structure.

The semiconductor device 300A further includes a sealant 320 between the edges of the device wafer 310 and the carrier wafer 110. The sealant 320 is within an opening formed by the beveled edge 110a and the beveled edge 310a. Each of the device wafer 310 and the carrier wafer 110 extend beyond the sealant 320. In some embodiments, an outermost portion of the sealant 320 is coplanar with an outermost edge of at least one of the carrier wafer 110 or the device wafer 310. In some embodiments, the sealant 320 extends beyond an outermost edge of at least one of the carrier wafer 110 or the device wafer 310. In some embodiments, the sealant 320 includes a resin.

Returning to the method 200 (FIG. 2), in operation 210 a removal process is performed on a non-bonding area of the device wafer. The non-bonding area of the device wafer is a portion of the device wafer between a device and an outermost periphery of the device wafer. In some embodiments, the removal process also removes a portion of the device wafer in an edge area of the device wafer. In some embodiments, the removal process also removes a portion of the carrier wafer in the edge area. In some embodiments, the removal process reduces a thickness in the non-bonding area of the device wafer. In some embodiments, a bonding oxide remains in the non-bonding area following the removal process. In some embodiments, portion of the sealant remains in the non-bonding area following the removal process. In some embodiments, the operation 210 is called a trimming process.

In some embodiments, the removal process includes one or more etching processes. In some embodiments, the one or more etch processes include dry etching using a plasma dry etch with a gas mixture having octafluorocyclobutane ($C_4F_8$), argon (Ar), oxygen ($O_2$), and helium (He), fluoroform ($CHF_3$) and He, carbon tetrafluoride ($CF_4$), difluoromethane ($CH_2F_2$), chlorine ($Cl_2$), and $O_2$, hydrogen bromide (HBr), $O_2$, and He, or a combination thereof with a pressure ranging from about 1 milliTorr (mTorr) to about 5 mTorr. If the pressure is too small, then a duration of the etching process is prolonged and output of the manufacturing process is reduced, in some instances. If the pressure is too great, then a risk of over etching of the device wafer increases, in some instances. In some embodiments, the one or more etch processes include wet etching using a diluted hydrofluoric acid (DHF) treatment, an ammonium peroxide mixture (APM), a sulfuric peroxide mixture (SPM), hot deionized water (DI water), or a combination thereof. In some embodiments, the one or more etch processes include wet etching using ammonia ($NH_3$) and hydrofluoric acid (HF) as etchants and inert gases such as, for example, Ar, xenon (Xe), He, or a combination thereof. In some embodiments, the flow rate of HF and $NH_3$ used in the etch process can each range from about 10 standard cubic centimeters per minute (sccm) to about 100 sccm. If the flow rate is too small, then a duration of the etching process is prolonged and output of the manufacturing process is reduced, in some instances. If the flow rate is too great, then a risk of over etching of the device wafer increases, in some instances. In some embodiments, the one or more etch processes are performed at a pressure ranging from about 5 mTorr to about 100 mTorr and a high temperature ranging from about 50° C. to about 120° C. If the pressure is too small, then a duration of the etching process is prolonged and output of the manufacturing process is reduced, in some instances. If the pressure is too great, then a risk of over etching of the device wafer increases, in some instances. If the temperature is too small, then a duration of the etching process is prolonged and output of the manufacturing process is reduced, in some instances. If the temperature is too great, then a risk of damage to the device increases, in some instances.

Figure 3B:
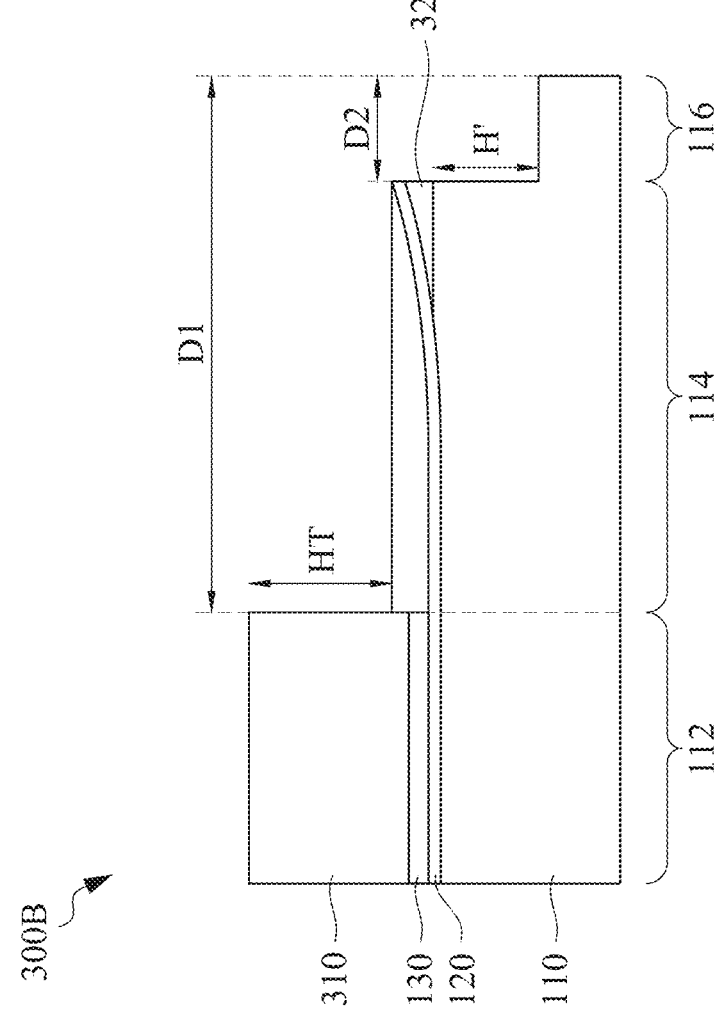

FIG. 3B is a cross-sectional view of a semiconductor device 300B in accordance with some embodiments. In some embodiments, the semiconductor device 300B is a cross-sectional view following operation 210 of the method 200 (FIG. 2). In some embodiments, the semiconductor device 300B is a cross-sectional view during a method other than the method 200 (FIG. 2). In comparison with the semiconductor device 300A (FIG. 3A), the semiconductor device 300B includes a portion of the device wafer 310 removed in non-bonding area 114; and an entirety of the device wafer 310 removed in the edge area 116. In addition, the semiconductor device 300B further includes a portion of the carrier wafer 110 removed in the edge area 116. The bonding oxide 120 remains in the non-bonding area; however, the bonding oxide 120 is removed in the edge area 116. Similarly, a portion of the sealant 320 remains in the non-bonding area 114, but the sealant 320 in the edge area 116 is completely removed. The distance D1 and the distance D2 are described above with respect to the semiconductor device 100 (FIG. 1) and are not explained in detail for the sake of brevity.

In some embodiments, a height HT between the topmost surface of the device wafer 310 in the non-bonding area 114 and the topmost surface of the device wafer 310 in the device area 112 ranges from about 735 μm to about 755 μm. In some embodiments, the height HT is approximately 745 μm. If the height HT is too small, then the removal process fails to remove a sufficient amount of the device wafer 310 in the non-bonding area 114 to allow exposing of the device 130 in a subsequent wafer thinning process, in some embodiments. If the height HT is too large, then a risk of over etching of the device wafer increases and the carrier wafer 110 is exposed during the subsequent wafer thinning process which increases a risk of forming an overhang structure close to the device 130, in some instances.

In some embodiments, a height H' between the topmost surface of the carrier wafer 110 in the edge area 116 and the topmost surface of the device wafer 310 in the non-bonding area 114 ranges from about 35 μm to about 45 μm. In some embodiments, the height H' is approximately 40 μm. If the height H' is too small, then a risk of fail to etch through the bonding oxide 120 and the sealant 320 in the edge area 116 increases, in some instances. If the height H' is too large, then a risk of forming of an overhang structure closer to the device 130 increases, in some instances.

Returning to the method 200 (FIG. 2), in the operation 215 a thickness of the device wafer is reduced. In some embodiments, reducing the thickness of the device wafer is performed to expose a backside of the device. In some embodiments, the thickness of the device wafer is reduced using at least one of a chemical mechanical polishing (CMP) process, a grinding process, an etching process, or another suitable material removal process. In some embodiments, the thickness of the device wafer is reduced until a bonding oxide is exposed. In some embodiments, the thickness reducing process causes an overhang structure in the edge area of the carrier wafer. In some embodiments, the overhang structure extends into the non-bonding area of the carrier wafer. The thickness reducing process fails to result in an overhang structure extending under the device. As a result, a risk of peeling or damage to the device during subsequent processing, such as forming a backside interconnect structure, is reduced or eliminated.

Figure 3C:
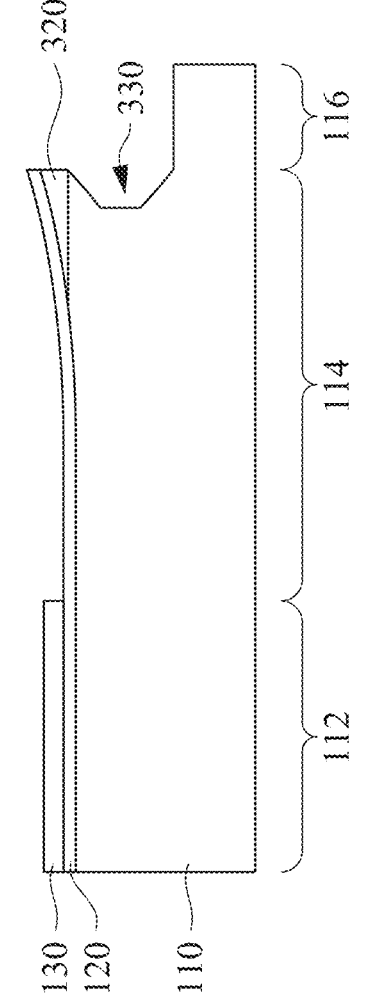

FIG. 3C is a cross-sectional view of a semiconductor device 300C in accordance with some embodiments. In some embodiments, the semiconductor device 300C is a cross-sectional view following operation 215 of the method 200 (FIG. 2). In some embodiments, the semiconductor device 300C is a cross-section view during a method other than the method 200 (FIG. 2). In comparison with the semiconductor device 300B (FIG. 3B), the device wafer 310 over the device 130 and the bonding oxide 120 is removed from the semiconductor device 300C. In some embodiments, the device wafer 310 over the device 130 and the bonding oxide 120 is removed using CMP, grinding, etching, or another suitable material removal process.

The semiconductor device 300C further includes an overhang structure 330. The overhang structure 330 is a recessed portion of the carrier wafer 110 that extend under the bonding oxide 120. In some embodiments, the overhang structure 330 extends under the sealant 320. The overhang structure 330 is a result of a sidewall of the carrier wafer 110 being exposed during the material removal process for removing the device wafer 310 (FIG. 3B). The overhang structure 330 is in the edge area 116 of the carrier wafer 110. In some embodiments, the overhang structure 330 extends into the non-bonding area 114 of the carrier wafer 110. The overhang structure 330 does not extend into the device area

112 of the carrier wafer 110. By separating the overhang structure 330 from the device area 112, a risk of peeling or damage to the device 130 is reduced or eliminated.

Returning to the method 200 (FIG. 2), in operation 220 an etching process is performed to remove a portion of the non-bonding area of the carrier wafer. The device is protected during the etching process of the operation 220. In some embodiments, the device is protected using a photoresist or a hard mask. In some embodiments, the device is protected using an etching mask. The etching process of the operation 220 is not performed on the device area of the device wafer and the carrier wafer. In some embodiments, the etching process of the operation 220 is limited to the non-bonding area. In some embodiments, the etching process of the operation 220 is performed on the non-bonding area and the edge area. In some embodiments, the etching process in the operation 220 is called a corona etching process. The etching process of the operation 220 removes the bonding oxide in the non-bonding area. In some embodiments, the etching process of the operation 220 also removes the sealant in the non-bonding area. In some embodiments, the etching process of the operation 220 also removes a portion of the edge area of the carrier wafer and increases a step height difference between the topmost surface of the non-bonding area of the carrier wafer and the topmost surface of the edge area of the carrier wafer. In some embodiments, the topmost surface of the non-bonding area of the carrier wafer is coplanar with the topmost surface of the device area of the carrier wafer. In some embodiments, the topmost surface of the non-bonding area of the carrier wafer is below the topmost surface of the device area of the carrier wafer.

In some embodiments, the etching process of the operation 220 includes one or more etching processes. In some embodiments, the one or more etch processes include dry etching using a plasma dry etch with a gas mixture having octafluorocyclobutane ($C_4F_8$), argon (Ar), oxygen ($O_2$), and helium (He), fluoroform ($CHF_3$) and He, carbon tetrafluoride ($CF_4$), difluoromethane ($CH_2F_2$), chlorine ($Cl_2$), and $O_2$, hydrogen bromide (HBr), $O_2$, and He, or a combination thereof with a pressure ranging from about 1 milliTorr (mTorr) to about 5 mTorr. If the pressure is too small, then a duration of the etching process is prolonged and output of the manufacturing process is reduced, in some instances. If the pressure is too great, then a risk of over etching of the device wafer increases, in some instances. In some embodiments, the one or more etch processes include wet etching using a diluted hydrofluoric acid (DHF) treatment, an ammonium peroxide mixture (APM), a sulfuric peroxide mixture (SPM), hot deionized water (DI water), or a combination thereof. In some embodiments, the one or more etch processes include wet etching using ammonia ($NH_3$) and hydrofluoric acid (HF) as etchants and inert gases such as, for example, Ar, xenon (Xe), He, or a combination thereof. In some embodiments, the flow rate of HF and $NH_3$ used in the etch process can each range from about 10 standard cubic centimeters per minute (sccm) to about 100 sccm. If the flow rate is too small, then a duration of the etching process is prolonged and output of the manufacturing process is reduced, in some instances. If the flow rate is too great, then a risk of over etching of the device wafer increases, in some instances. In some embodiments, the one or more etch processes are performed at a pressure ranging from about 5 mTorr to about 100 mTorr and a high temperature ranging from about 50° C. to about 120° C. If the pressure is too small, then a duration of the etching process is prolonged and output of the manufacturing process is reduced, in some instances. If the pressure is too great, then a risk of over etching of the device wafer increases, in some instances. If the temperature is too small, then a duration of the etching process is prolonged and output of the manufacturing process is reduced, in some instances. If the temperature is too great, then a risk of damage to the device increases, in some instances. In some embodiments, a recipe for the etching process in the operation 220 is a same recipe as for the material removal process in the operation 210. In some embodiments, a recipe for the etching process in the operation 220 is a different recipe from the material removal process in the operation 210.

Figure 3D:
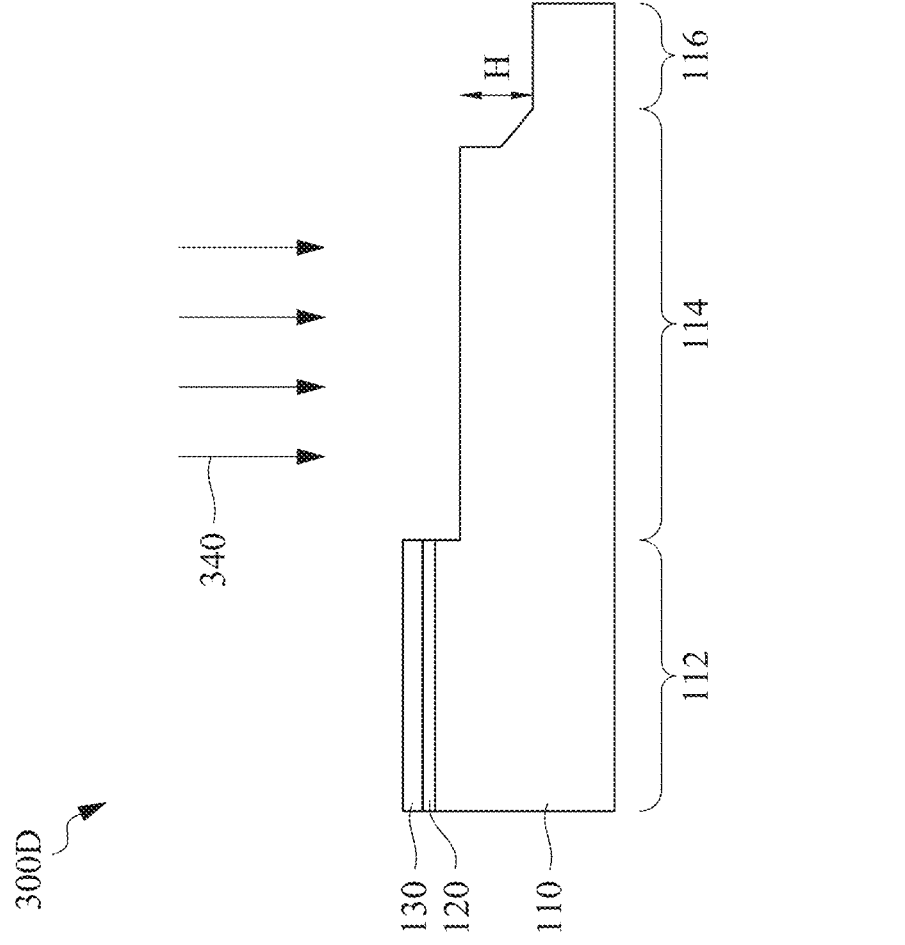

FIG. 3D is a cross-sectional view of a semiconductor device 300D in accordance with some embodiments. In some embodiments, the semiconductor device 300D is a cross-sectional view following operation 220 of the method 200 (FIG. 2). In some embodiments, the semiconductor device 300D is a cross-section view during a method other than the method 200 (FIG. 2). In comparison with the semiconductor device 300C (FIG. 3C), an etching process 340 is performed on the non-bonding area 114 of the carrier wafer. The device 130 is protected during the etching process 340. In some embodiments, the etching process 340 is also performed on the edge area 116 of the carrier wafer 110. In the semiconductor device 300D, the bonding oxide 120 and the sealant 320 in the non-bonding area 114 of the carrier wafer 110 are removed by the etching process 340. The etching process 340 also helps to remove the overhang structure 330 from the semiconductor device 300C (FIG. 3C) by removing the bonding oxide 120, the sealant 320, and the carrier wafer 110 above the overhang structure 330 (FIG. 3C). The removal of the overhang structure 330 helps to reduce or eliminate the risk of peeling or damage to the device 130 during subsequent processing.

In some embodiments, the topmost surface of the non-bonding area 114 of the carrier wafer 110 is lower than the topmost surface of the device area 112 of the carrier wafer 110. In some embodiments, the topmost surface of the non-bonding area 114 of the carrier wafer 110 is coplanar with the topmost surface of the device area 112 of the carrier wafer 110. A height H difference exists between the topmost surface of the edge area 116 of the carrier wafer 110 and the topmost surface of the non-bonding area 114 of the carrier wafer 110. The height H is similar to the height H in the semiconductor device 100 (FIG. 1) and is not discussed in detail for the sake of brevity. In some embodiments, the height H is greater than the height H' from the semiconductor device 300B (FIG. 3B).

Returning to the method 200 (FIG. 2), in operation 225 additional processing is performed on the device wafer. In some embodiments, the additional processing includes formation of additional layers on the device wafer, dicing of the device wafer, flip-chip bonding of the device wafer, de-bonding device from carrier wafer, or other suitable additional processing.

One of ordinary skill in the art would recognize that the method 200 is capable of being modified. In some embodiments, at least one operation from the method 200 is omitted. For example, in some embodiments, the operation 225 is performed by a different entity. In some embodiments, an order of operations of the method 200 is adjusted. For example, in some embodiments, the operations 210 and 215 are combined into a single operation. In some embodiments, at least one additional operation is added to the method 200. For example, in some embodiments, a singulation process is performed to separate individual devices on the device wafer. One of ordinary skill in the art would understand that other modifications to the method 200 are within the skill of one of ordinary skill in the art.

An aspect of this description relates to a method of manufacturing a semiconductor device. The method includes reducing a thickness of a device wafer bonded to a carrier wafer, wherein the device wafer includes a device, a portion of the carrier wafer beyond the device, in a plan view, is called a non-bonding area, and a portion of the carrier wafer overlapping the device, in the plan view, is called a device area. The method further includes performing an etching process on the non-bonding area of the carrier wafer, wherein the etching process is completely outside the device area of the carrier wafer. In some embodiments, reducing the thickness of the device wafer includes forming an overhang structure in the carrier wafer. In some embodiments, performing the etching process on the non-bonding area includes removing the overhang structure from the carrier wafer. In some embodiments, performing the etching process on the non-bonding area includes performing a corona etching process. In some embodiments, the method further includes bonding the device wafer to the carrier wafer using a bonding oxide. In some embodiments, reducing the thickness of the device wafer includes exposing a portion of the bonding oxide. In some embodiments, performing the etching process on the non-bonding area of the carrier wafer includes removing the bonding oxide from the non-bonding area of the carrier wafer. In some embodiments, performing the etching process on the non-bonding area of the carrier wafer includes recessing a topmost surface of the non-bonding area with respect to a topmost surface of the device area of the carrier wafer. In some embodiments, the method further includes performing a trimming process on the device wafer prior to reducing the thickness of the device wafer. In some embodiments, performing the trimming process includes defining a step height difference between a topmost surface of the device wafer over the device and a topmost surface of the device beyond the device, in a plan view, ranging from about 735 microns ($\mu$m) to about 755 $\mu$m. In some embodiments, performing the trimming process includes defining a step height difference between a topmost surface of the device wafer beyond the device, in a plan view, and a topmost surface of an edge area of the carrier wafer ranging from about 35 $\mu$m to about 45 $\mu$m.

An aspect of this description relates to a method of manufacturing a semiconductor device. The method includes bonding a device wafer to a carrier wafer using a bonding oxide, wherein the device wafer includes a device, and a non-bonding area of the device wafer surrounds the device. The method further includes performing a trimming process on the device wafer to reduce a thickness of the device wafer in the non-bonding area of the device wafer. The method further includes reducing a thickness of the device wafer, after the trimming process, to expose the device. The method further includes performing a corona etching process on a non-bonding area of the carrier wafer. In some embodiments, reducing the thickness of the device wafer exposes the bonding oxide over the non-bonding area of the carrier wafer. In some embodiments, performing the corona etching process removes the bonding oxide over the non-bonding area of the carrier wafer. In some embodiments, reducing the thickness of the device wafer includes forming an overhang structure in the carrier wafer. In some embodiments, performing the corona etching process removes the overhang structure.

An aspect of this description relates to a semiconductor device. The semiconductor device includes a device; a bonding oxide; and a carrier wafer bonded to the device through the bonding oxide. The carrier wafer includes a device area overlapped by the device in a plan view. The carrier wafer further includes an edge area adjacent to an outermost periphery of the carrier wafer, wherein the edge area has a first thickness. The carrier wafer further includes a non-bonding area between the device area and the edge area, wherein the non-bonding area has a second thickness greater than the first thickness, a first width of the non-bonding area is greater than a second width of the edge area, and the non-bonding area is free of an overhang structure. In some embodiments, the second width ranges from about 0.3 millimeters (mm) to about 0.45 mm. In some embodiments, the first width ranges from about 1.05 mm to about 1.6 mm. In some embodiments, a difference between the first thickness and the second thickness ranges from about 50 microns (μm) to about 60 μm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   reducing a thickness of a device wafer bonded to a carrier wafer, wherein the device wafer comprises a device, a portion of the carrier wafer beyond the device, in a plan view, is called a non-bonding area, and a portion of the carrier wafer overlapping the device, in the plan view, is called a device area;
   performing an etching process on the non-bonding area of the carrier wafer, wherein the etching process is performed completely outside the device area of the carrier wafer.

2. The method of claim 1, wherein reducing the thickness of the device wafer comprises forming an overhang structure in the carrier wafer.

3. The method of claim 2, wherein performing the etching process on the non-bonding area comprises removing the overhang structure from the carrier wafer.

4. The method of claim 1, wherein performing the etching process on the non-bonding area comprises performing a corona etching process.

5. The method of claim 1, further comprising bonding the device wafer to the carrier wafer using a bonding oxide.

6. The method of claim 5, wherein reducing the thickness of the device wafer comprises exposing a portion of the bonding oxide.

7. The method of claim 6, wherein performing the etching process on the non-bonding area of the carrier wafer comprises removing the bonding oxide from the non-bonding area of the carrier wafer.

8. The method of claim 1, wherein performing the etching process on the non-bonding area of the carrier wafer comprises recessing a topmost surface of the non-bonding area with respect to a topmost surface of the device area of the carrier wafer.

9. The method of claim 1, further comprising performing a trimming process on the device wafer prior to reducing the thickness of the device wafer.

10. The method of claim 9, wherein performing the trimming process comprises defining a step height difference between a topmost surface of the device wafer over the device and a topmost surface of the device beyond the device, in a plan view, ranging from about 735 microns (μm) to about 755 μm.

11. The method of claim 9, wherein performing the trimming process comprises defining a step height difference between a topmost surface of the device wafer beyond the device, in a plan view, and a topmost surface of an edge area of the carrier wafer ranging from about 35 μm to about 45 μm.

12. A method of manufacturing a semiconductor device, the method comprising:
   bonding a device wafer to a carrier wafer using a bonding oxide, wherein the device wafer comprises a device, and a non-bonding area of the device wafer surrounds the device;
   performing a trimming process on the device wafer to reduce a thickness of the device wafer in the non-bonding area of the device wafer;
   reducing a thickness of the device wafer, after the trimming process, to expose the device; and
   performing a corona etching process on a non-bonding area of the carrier wafer.

13. The method of claim 12, wherein reducing the thickness of the device wafer exposes the bonding oxide over the non-bonding area of the carrier wafer.

14. The method of claim 13, wherein performing the corona etching process removes the bonding oxide over the non-bonding area of the carrier wafer.

15. The method of claim 12, wherein reducing the thickness of the device wafer comprises forming an overhang structure in the carrier wafer.

16. The method of claim 15, wherein performing the corona etching process removes the overhang structure.

17. A method of manufacturing a semiconductor device, the method comprising:
   bonding a device wafer to a carrier wafer using a bonding oxide, wherein the device wafer comprises a device and has a first beveled edge;
   forming a sealant between the first beveled edge and the carrier wafer;
   removing a portion of the first beveled edge, wherein removing the portion of the beveled edge comprises removing a portion of the carrier wafer;
   thinning the device wafer adjacent to the portion of the first beveled edge; and
   removing a portion of the device wafer to expose the device.

18. The method of claim 17, further comprising performing a corona etching process on an area of the carrier wafer offset from the device in a plan view.

19. The method of claim 18, wherein performing the corona etching process comprises removing portions of the bonding oxide offset from the device in the plan view.

20. The method of claim 17, wherein thinning the device wafer adjacent to the portion of the first beveled edge comprises forming an overhang in the carrier wafer.

* * * * *